(12) United States Patent
Meagher

(10) Patent No.: US 7,613,974 B2
(45) Date of Patent: Nov. 3, 2009

(54) FAULT DETECTION METHOD AND APPARATUS

(75) Inventor: Thomas Bruce Meagher, Houston, TX (US)

(73) Assignee: ICS Triplex Technology Limited, Essex (GB)

( * ) Notice: Subject to any disclaimer, the term of this patent is extended or adjusted under 35 U.S.C. 154(b) by 313 days.

(21) Appl. No.: 11/689,224

(22) Filed: Mar. 21, 2007

(65) Prior Publication Data

US 2007/0277067 A1  Nov. 29, 2007

Related U.S. Application Data

(60) Provisional application No. 60/785,537, filed on Mar. 24, 2006.

(30) Foreign Application Priority Data

May 31, 2006  (EP)  .................... 06114800

(51) Int. Cl.
*G01R 31/28* (2006.01)
(52) U.S. Cl. ............ 714/740; 714/25; 714/48; 714/703; 714/704; 714/715; 714/724; 714/732; 714/736; 714/742; 714/799; 714/824; 327/2; 327/3; 327/12; 327/39; 327/40; 324/76.21; 324/76.29; 324/76.23; 324/76.24; 324/76.52
(58) Field of Classification Search .................. None
See application file for complete search history.

(56) References Cited

U.S. PATENT DOCUMENTS

| 3,582,974 | A | * | 6/1971 | Favin et al. ............... 327/58 |
| 3,639,778 | A | * | 2/1972 | Cereghino et al. ......... 326/11 |
| 4,535,378 | A |   | 8/1985 | Endo et al. |
| 4,539,683 | A |   | 9/1985 | Hahn et al. |
| 4,679,028 | A | * | 7/1987 | Wilson et al. ............. 341/120 |
| 4,866,449 | A | * | 9/1989 | Gaffney .................... 342/151 |
| 5,068,657 | A | * | 11/1991 | Tsai ......................... 341/120 |
| 5,128,625 | A |   | 7/1992 | Yatsuzuka et al. |

(Continued)

FOREIGN PATENT DOCUMENTS

DE  1 9750349  5/1998

(Continued)

OTHER PUBLICATIONS

European Search Report for European Application 06114802.9, Sep. 5, 2006, European Patent Office.

(Continued)

*Primary Examiner*—John P Trimmings
(74) *Attorney, Agent, or Firm*—Boyle Fredrickson LLP; William R. Walbrun

(57) ABSTRACT

This invention relates to fault detection in electrical circuits. The invention provides a method and apparatus for testing an input circuit by generating a periodic test signal having a predetermined phase and a predetermined amplitude; summing the test signal and an input signal to provide a summed signal; processing the summed signal to provide an output signal; generating an extracted test signal from the output signal; comparing the extracted test signal with a reference signal representing said periodic test signal; generating an error signal in dependence upon the result of said comparing step. The invention also provides a method and apparatus for testing a plurality of adjacent input circuits.

8 Claims, 7 Drawing Sheets

U.S. PATENT DOCUMENTS

| | | | |
|---|---|---|---|
| 5,293,082 A | | 3/1994 | Bathaee |
| 5,324,989 A | | 6/1994 | Thornton |
| 5,552,881 A | | 9/1996 | Jezwinski et al. |
| 5,594,439 A | * | 1/1997 | Swanson ............ 341/118 |
| 5,621,603 A | | 4/1997 | Adamec et al. |
| 5,774,321 A | | 6/1998 | Kim et al. |
| 5,847,558 A | * | 12/1998 | McGuire et al. ........ 324/76.13 |
| 5,867,014 A | | 2/1999 | Wrathall et al. |
| 5,896,263 A | | 4/1999 | Terdan et al. |
| 5,909,660 A | | 6/1999 | Foote et al. |
| 5,995,914 A | * | 11/1999 | Cabot ............ 702/109 |
| 6,061,006 A | | 5/2000 | Hopkins |
| 6,125,024 A | | 9/2000 | LeComte et al. |
| 6,320,283 B1 | | 11/2001 | Salim et al. |
| 6,351,835 B1 | | 2/2002 | Sakaguchi |
| 6,400,163 B1 | | 6/2002 | Melcher et al. |
| 6,459,599 B1 | | 10/2002 | Agirmann et al. |
| 6,557,131 B1 | | 4/2003 | Arabi |
| 6,594,129 B1 | | 7/2003 | Baba et al. |
| 6,653,963 B1 | | 11/2003 | Barrenscheen et al. |
| 6,657,464 B1 | | 12/2003 | Balardeta et al. |
| 6,768,350 B1 | | 7/2004 | Dickey |
| 7,159,159 B2 | * | 1/2007 | Sunter ............ 714/724 |
| 2003/0011353 A1 | * | 1/2003 | Whitehead et al. ....... 324/76.52 |
| 2003/0043521 A1 | | 3/2003 | Thiele |
| 2003/0063679 A1 | | 4/2003 | Scrofano |
| 2003/0110427 A1 | * | 6/2003 | Rajsuman et al. ........... 714/724 |
| 2004/0125007 A1 | | 7/2004 | Pezzini |
| 2005/0135037 A1 | | 6/2005 | Thiery et al. |
| 2005/0154945 A1 | | 7/2005 | Haag et al. |
| 2005/0174273 A1 | * | 8/2005 | Luo et al. ............ 341/120 |
| 2005/0248477 A1 | | 11/2005 | Jongsma et al. |
| 2006/0061303 A1 | | 3/2006 | Takeda et al. |
| 2006/0174177 A1 | * | 8/2006 | Weinstein et al. ........... 714/742 |

FOREIGN PATENT DOCUMENTS

| | | |
|---|---|---|
| EP | 0325786 | 8/1989 |
| EP | 0789458 | 8/1997 |
| EP | 1322139 | 6/2003 |
| EP | 1545163 | 6/2005 |
| JP | 5 5096708 | 7/1980 |
| JP | 6 0236073 | 1/1985 |
| JP | 0 8023244 | 1/1996 |
| WO | WO03107019 | 12/2003 |

OTHER PUBLICATIONS

European Search Report for European Application 06114803.7, Sep. 1, 2006, European Patent Office.

European Search Report for European Application 06114806.0, Aug. 30, 2006, European Patent Office.

European Search Report for European Application 06114800.3, Sep. 1, 2006, European Patent Office.

European Search Report for European Application 06114804.5, Aug. 18, 2006, European Patent Office.

European Search Report for European Application 06114805.2, Aug. 24, 2006, European Patent Office.

European Search Report for European Application 06114801.1, Sep. 11, 2006, European Patent Office.

* cited by examiner

FAULT DETECTION METHOD AND APPARATUS

CROSS-REFERENCE TO RELATED APPLICATIONS

This application is related to and claims priority from U.S. Provisional Application No. 60/785,537 filed Mar. 24, 2006 entitled Fault Detection and Apparatus, which is incorporated fully herein by reference.

BACKGROUND a. Field of the Invention

This invention relates to fault detection in electrical circuits, in particular it relates to fault detection for a plurality of adjacent input circuits.

In safety control systems, fault tolerance is of utmost importance. Fault tolerance is the ability to continue functioning in the event of one or more failures within the system.

Fault tolerance may be achieved by a number of different techniques, each with its specific advantages and disadvantages. One example of fault tolerance is known as Hardware Implemented Fault Tolerance (HIFT). HIFT means that the system relies on robust hardware circuits (as opposed to complex software algorithms) to perform the fault detection and redundancy management functions. A significant advantage HIFT has over software-implemented fault tolerance is that HIFT eliminates the overhead for communications between processors, leaving more time for controlling the process. This makes HIFT systems significantly faster and more dependable than systems using software-implemented fault tolerance.

An example of a HIFT system is a system which provides redundancy, in particular Triple Modular Redundancy (TMR). Using TMR, critical circuits are triplicated and perform identical functions simultaneously and independently. The data output from each of the three circuits is voted in a majority-voting circuit, before affecting the system's outputs. If one of the triplicated circuits fails, its data output is ignored. However, the system continues to output to the process the value (voltage, current level, or discrete output state) that agrees with the majority of the functional circuits. TMR provides continuous, predictable operation.

HIFT and TMR provides for automatic fault recovery with no disruption to system operation and ensures minimal fault detection periods.

Another approach to fault tolerance is the use of hot-standby modules. This approach provides a level of fault tolerance whereby the standby module maintains system operation in the event of module failure. With this approach there may be some disruption to system operation during the changeover period if the modules are not themselves fault-tolerant.

Fault tolerant systems ideally create a Fault Containment Region (FCR) to ensure that a fault within the FCR boundary does not propagate to the remainder of the system. This enables multiple faults to co-exist on different parts of a system without affecting operation.

Fault tolerant systems generally employ dedicated hardware and software test and diagnostic regimes that provide very fast fault recognition and response times to provide a safer system.

Commonly, it is possible to repair faults without interrupting system operation (known as hot replacement). For example active and standby module may operate in parallel so that if an active module becomes faulty there is an automatic change over to a standby module.

Safety control systems are generally designed to be 'fail-operational/fail-safe'. Fail operational means that when a failure occurs, the system continues to operate: it is in a fail-operational state. The system should continue to operate in this state until the failed module is replaced and the system is returned to a fully operational state.

An example of fail safe operation occurs, for example if, in a TMR system, a failed module is not replaced before a second failure in a parallel circuit occurs, the second failure should cause the TMR system to shut down to a fail-safe state.

Typical safety control applications include emergency and safety shutdown systems, process control, reactor control, wellhead control, turbine and compressor control, fire and gas detection and abatement, and are applicable to many industries including oil and gas production and refining, chemical production and processing, power generation, paper and textile mills and sewage treatment plants.

SUMMARY OF THE INVENTION

According to the invention there is provided a method of testing an input circuit comprising the steps of: generating a periodic test signal having a predetermined phase and a predetermined amplitude; summing the test signal and an input signal to provide a summed signal; processing the summed signal to provide an output signal; generating an extracted test signal from the output signal; comparing the extracted test signal with a reference signal representing said periodic test signal; generating an error signal in dependence upon the result of said comparing step.

Preferably the test signal comprises a symmetrical signal having a test signal period and in which the output signal is sampled at intervals of a sample period and averaged over a moving average period equal to an integer multiple of the test signal period and in which the sample period is such that the average value of the contribution from the symmetrical test signal over said moving average period is equal to zero.

In a preferred embodiment the test signal is a sinusoidal signal.

Preferably, the moving average period is equal to the period of the test signal. Even more preferably the test signal period is 4 ms; the sample period is 1 ms, and an average of the previous four samples is generated every 1 ms. In one embodiment of the invention a plurality of independent input circuits are tested according to the method of any one of the preceding claims and in which a plurality of test signals are generated by a method comprising the steps of; generating a digital representation of a periodic test signal, the digital representation comprising a number of bits equal to the number of test signals to be generated; storing said digital representation in a shift register; generating a plurality of digital test signals from a plurality of taps from the shift register such that each digital test signal comprises a uniquely phased digital pattern; low pass filtering each digital test signal to generate a plurality of unique analogue test signals.

Preferably a first test signal used to test a first input circuit is arranged to have as great a phase separation as possible from a second test signal used to test a second adjacent input circuit.

According to another aspect of the invention there is provided a method of detecting in input fault in replicated input circuits in which the replicated input circuits are all arranged to receive a single input signal, the method comprising the steps of: generating an error signal for each replicated circuit as described previously, and wherein a test signal for each replicated input circuit is arranged to have a small frequency difference with a test signal for each other replicated circuit such that in the event of one of the input circuits having an open circuit input the resulting output signal will exhibit a significant amplitude variation due to said test signals beating against one another.

Preferably. the frequency difference between the test signals for replicated input circuits is substantially equal to 0.2%.

According to another aspect of the invention there is also provided n apparatus for testing an input circuit comprising: means for generating a periodic test signal having a predetermined phase and a predetermined amplitude; an adder for summing the test signal and an input signal to provide a summed signal; means for processing the summed signal to provide an output signal; means for generating an extracted test signal from the output signal; a comparator for comparing the extracted test signal with a reference signal representing said periodic test signal and for generating an error signal in dependence upon said comparison.

BRIEF DESCRIPTION OF THE DRAWINGS

The invention will now be described, by way of example only, with reference to the accompanying drawings in which.

DETAILED DESCRIPTION

Figure 1:
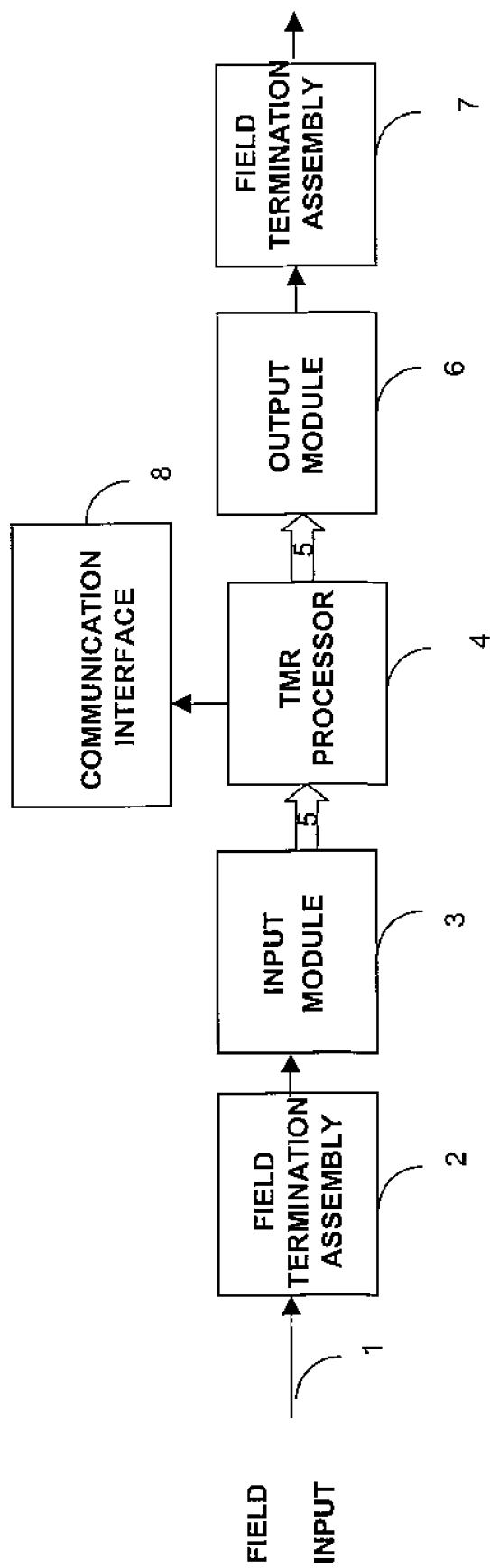
FIG. 1 illustrates schematically a fault tolerant architecture.

Referring now to FIG. 1, signals 1 from an input field device (not shown) are connected to the system via an input Field Termination Assembly (FTA) 2. An input module 3 receives, buffers and carries out any necessary conversion of the input data from the field device. The input data is then transmitted over a triplicated Inter-Module Bus (IMB) 5 to a TMR processor 4. Triplicated microprocessors of the TMR processor receive the input data from each channel of the IMB 5 and carry out a majority vote of the data. During data processing, each of the three processors compares and majority votes its input data against that of the other two processors. The processors synchronously execute the application program, and the derived output data is transmitted back to the IMB. An output module 6 receives, majority votes, and carries out any necessary conversion of the output data from the TMR processor 4. The output circuits are then driven by the majority-voted command. The output signals are connected to a field device (not shown) via an output FTA 7. A communications interface 8 provides facilities to allow systems to be networked using peer to peer communications links, the collection of Sequence of Events (SOE) data, and connection to other systems.

If an internal circuit in the system fails, it is simply voted out. Comprehensive distributed voting both out-votes failures, preventing them from being propagated into the process, and simplifies the process of identifying where faults have occurred by means identifying the source of a discrepant value.

For safety systems it is beneficial for line monitored analogue and digital input modules to detect open circuit faults between the Field Termination Assembly (FTA) and the input module itself. The requirement also exists that any fault in the components of each input circuit should be detectable.

Figure 2:
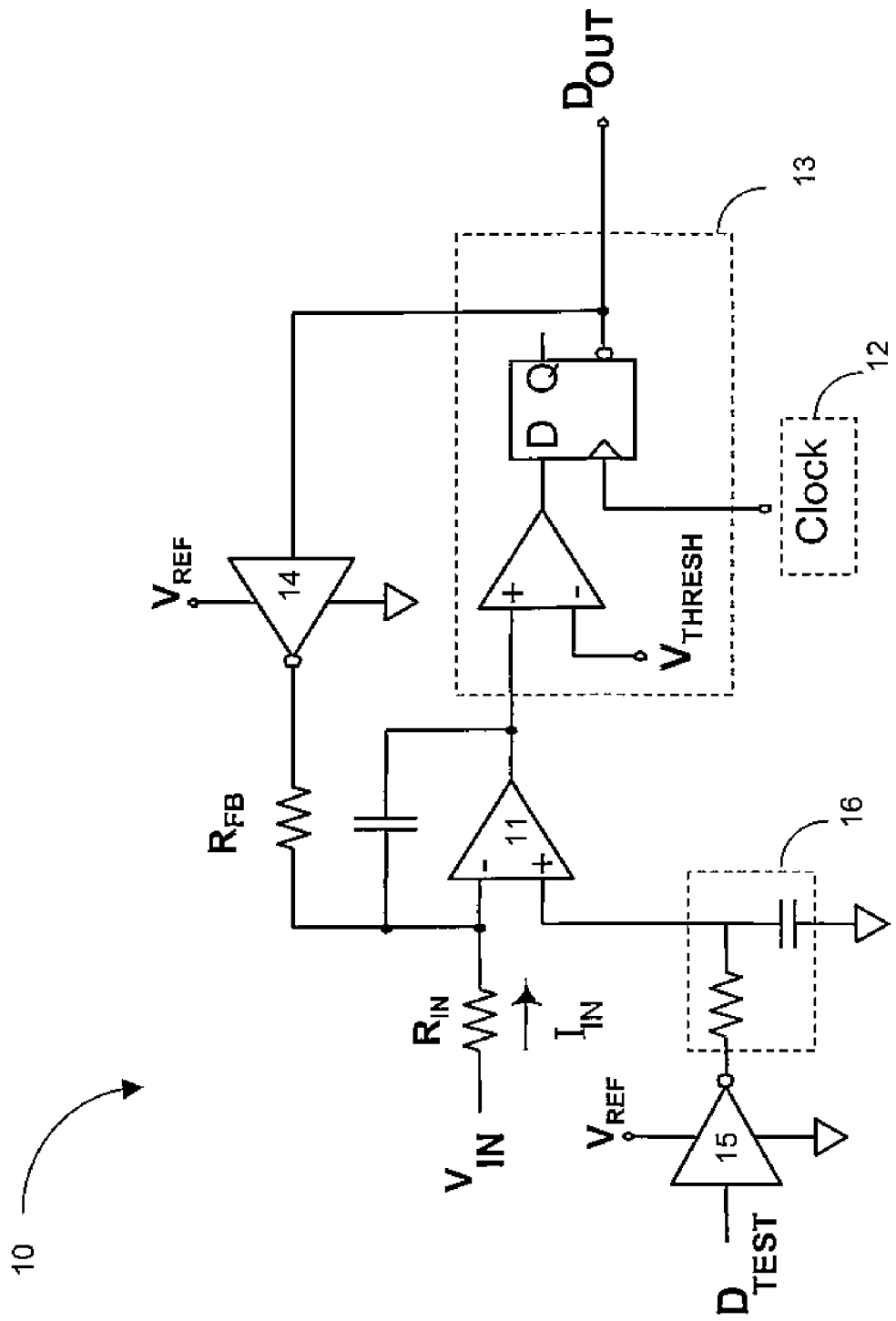
FIG. 2 illustrates a sigma-delta input circuit.

FIG. 2 illustrates a sigma-delta analogue to digital (A/D) converter 10 used by the input module 3. The input module 3 comprises an array of 42×3 triplicated sigma-delta A/D converters 10. There is a dedicated A/D converter for each of the three input 'slices'. To maximize fault detection no buffers are inserted in the signal path.

The sigma-delta A/D converter 10 comprises an integrator 11, a one-bit A/D converter 13 and a one-bit D/A converter 14. A test signal $D_{TEST}$ is converted by a one-bit D/A converter 15 and connected to a first input of the integrator 11 via an RC low pass filter 16. An input scaling resistor $R_{IN}$ connects an input $V_{IN}$ of the module to a second inverting input of the integrator 11. The output of the integrator 11 is converted to a digital output by the one-bit A/D converter 13. The one-bit D/A converter 14 feeds back an analogue version of the digital output to the inverting input via a feed back resistor $R_{FB}$.

Figure 3:
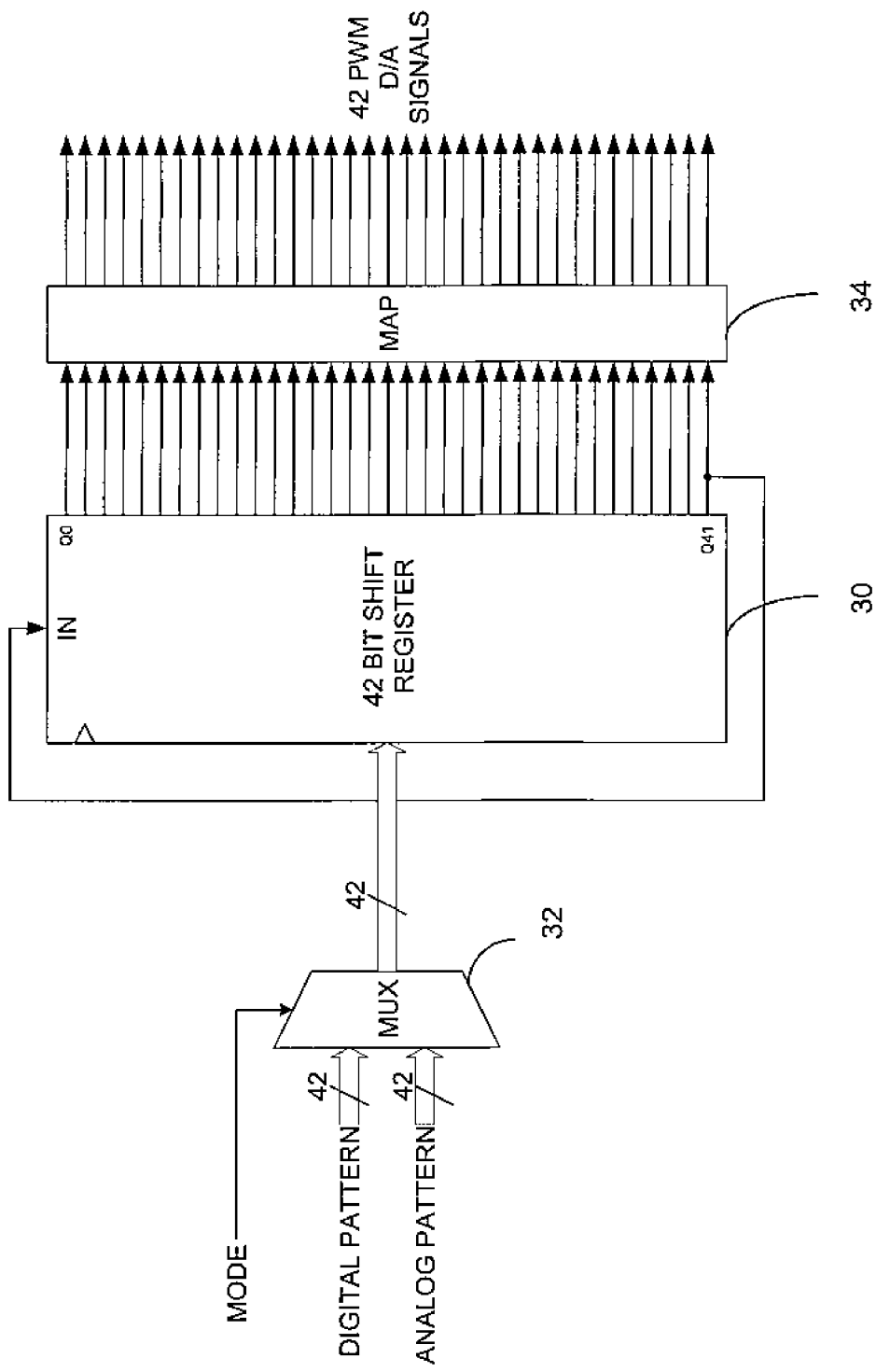
FIG. 3 illustrates generation of digital test signals.
Figure 4:
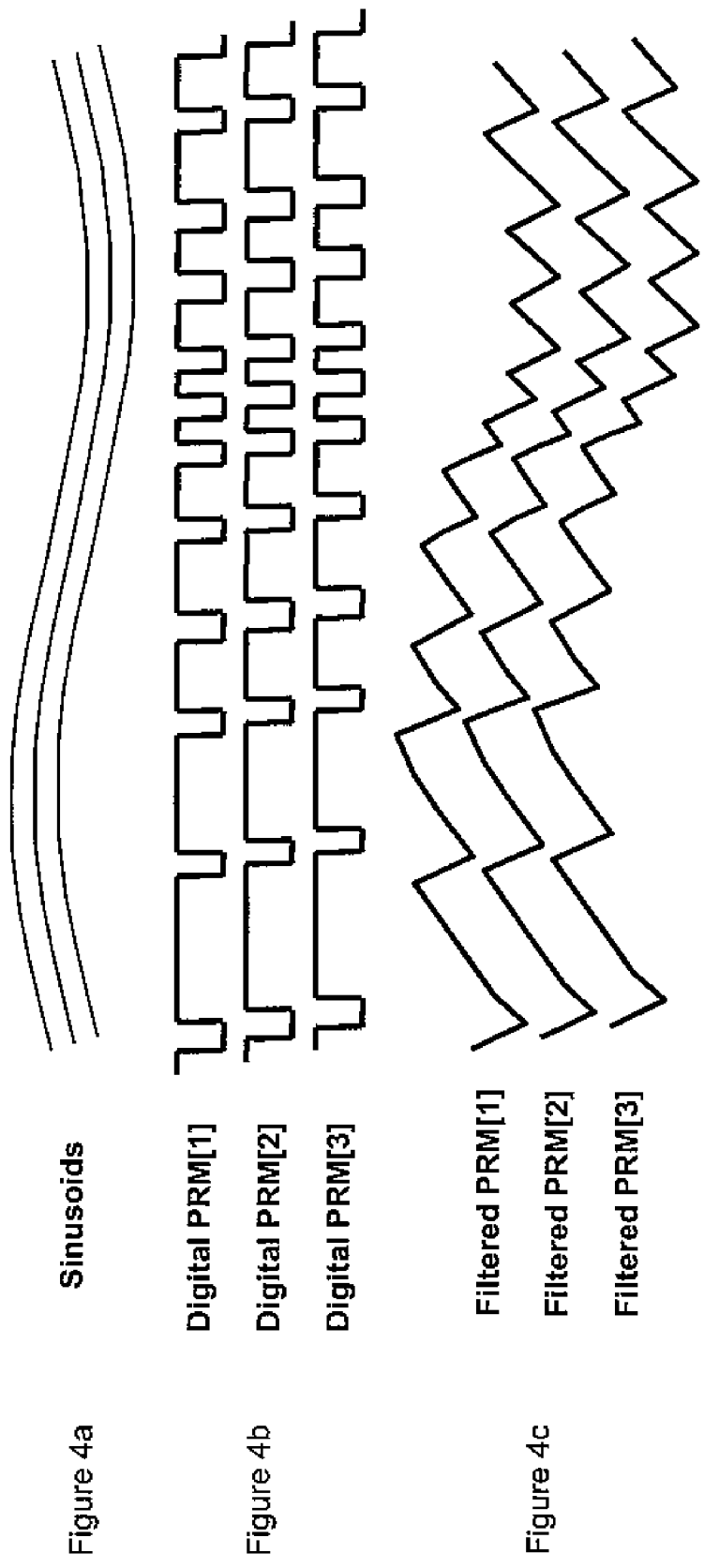
FIGS. 4a to 4d illustrates tests signals before and after low pass filtering.

Generation of test signal $D_{TEST}$ will now be described, with reference to FIG. 3. The $D_{TEST}$ digital test signal is produced by an FPGA (not shown) and is unique for each of the 42×3 A/D circuits 10. A pattern of forty-two one's and zero's is stored in the FPGA and is circulated through a forty two bit shift register 30. The ratio of one's to zeros in the circulating digital pattern produces an average DC offset for an array of channels. Different patterns, for example as shown in FIG. 4d, are used for different input module types (eg analogue or digital) generating a different offset, allowing the centre point of the input voltage span to be tailored to suit the purpose of the module. The pattern to be used is selected using a multiplexer 32. Each tap of the shift register 30 produces a uniquely phased digital pattern as shown in FIG. 4b. Each data stream is filtered via the D/A converter 15 and RC filter 16 shown in FIG. 2, and forty two unique roughly sinusoidal signals are produced, as shown in FIG. 4c.

It is an advantage if the data stream is divided into segments which are averaged in order to remove the test signal from the final output signal. In the preferred embodiment the system provides a new input channel result every millisecond. The final result is a boxcar average of the four previous results. The test signal is programmed to periodically repeat at a four millisecond rate, so that it is effectively eliminated from the output signal.

In other embodiments the test signal repeats at a frequency equal to or an integral multiple of the frequency of a moving average (or boxcar) function and the sample period is arranged such that the average of the test signal over the moving average period is equal to zero.

Figure 5:
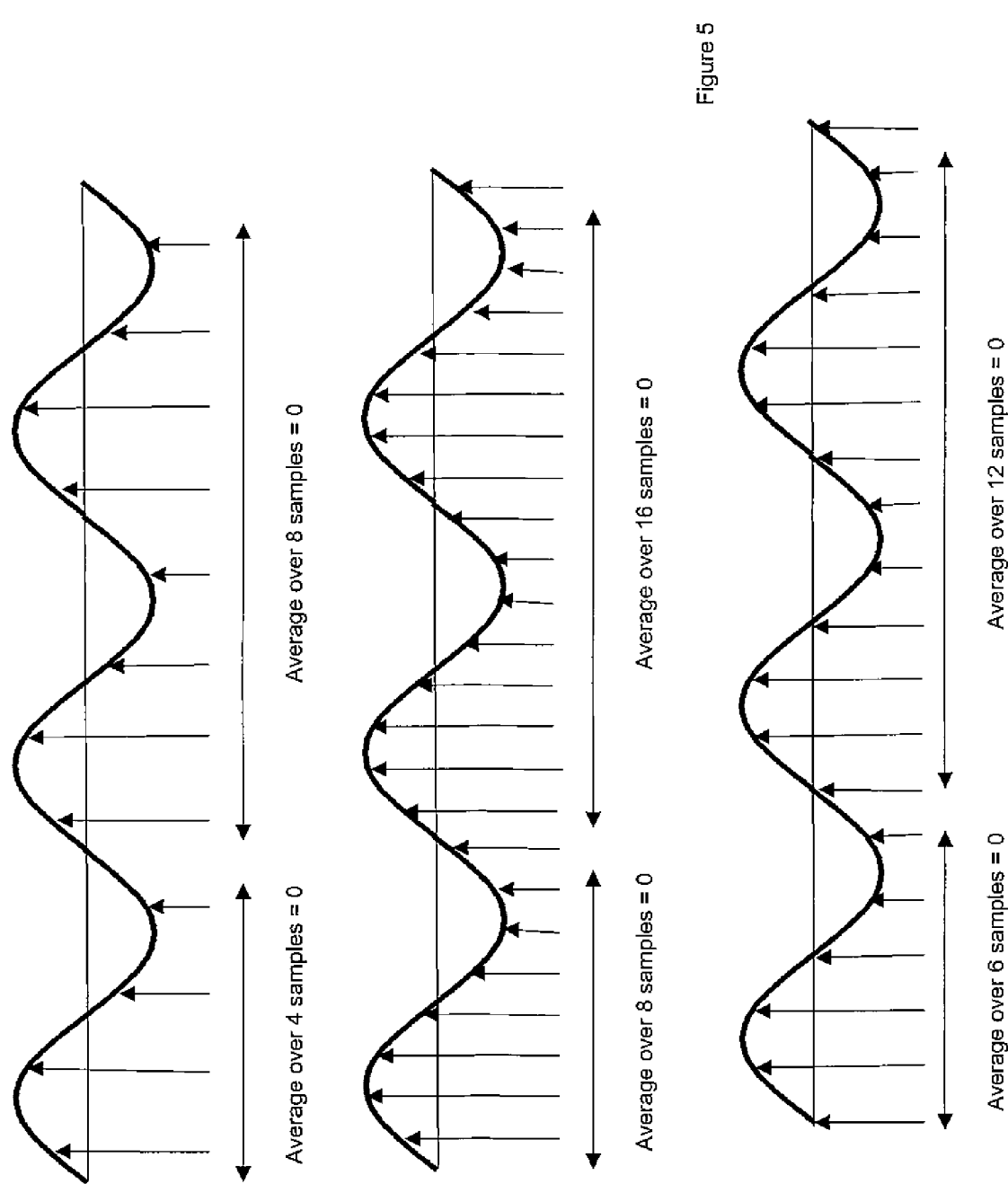
FIG. 5 illustrates the removal of the test signals from the true signal by block averaging.

Because of the symmetry of a sinusoidal test signal numerous arrangements are possible. Examples of possible arrangements are shown in FIG. 5.

It will be appreciated that other forms of periodic test signal could also be use so long as the sample frequency and sample period is arranged such that the resulting average of the contribution by the test signal is equal to zero.

Figure 7:
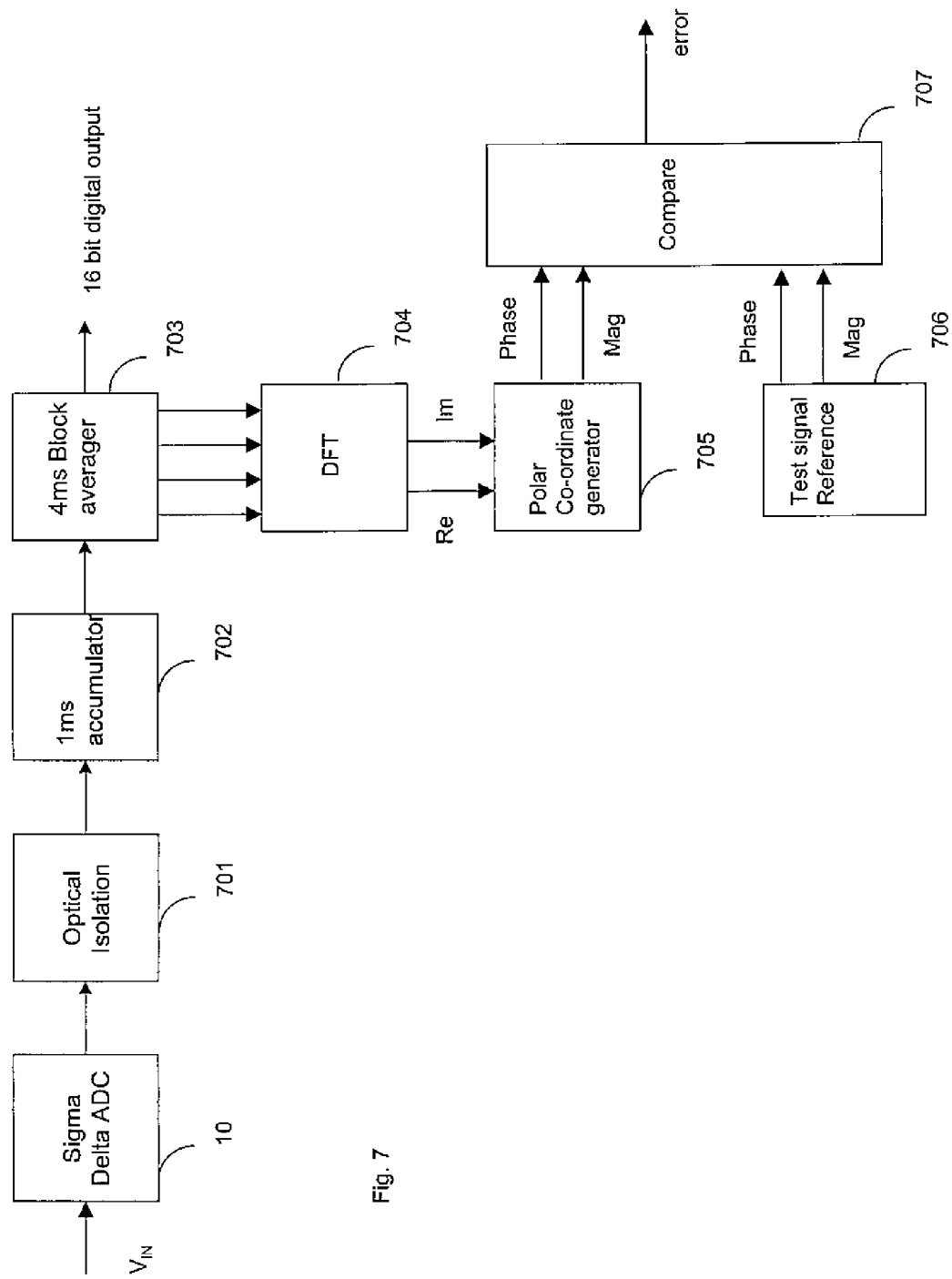
FIG. 7 illustrates generation of a digital signal representing an input analogue signal and a signal representing an input test signal from a serial digital signal.

Referring now to FIG. 7 which illustrates production of an output test signal, a serial binary sampled values are optically isolated from the output signal by an optical isolator 701. Isolated serial binary output samples are accumulated for 1 ms synchronously with the test signal phase by an accumulator 702. A 16 bit sample value is presented to a block averager 703 every ins. Four consecutive samples are averaged every ins to generate a digital output representing the analogue input.

The test signal is extracted by sending quadrant samples Sample(0), Sample(1), Sample(2), Sample(3) to a Discrete Fourier Transformer (DFT) 704. In the preferred embodiment a simple four point DFT is used so:

$$SIGNAL_{RE} = Sample(0) - Sample(2)$$

$$SIGNAL_{IM} = Sample(1) - Sample(3)$$

Although in other embodiments using more samples more complex DFT calculations will be required.

A polar co-ordinate generator 705 generates the phase and magnitude of the test signal for comparison with previously stored reference signals 706. A comparator 707 continuously compares the measured test signal with the reference value and generates an error condition in the event that an error is detected.

The test signals are calibrated by connecting all the inputs to a low resistance source and measuring the test signal amplitudes and phases for several seconds. These values are stored in the test signal reference memory 706 for continuous comparison during normal operating mode (see FIG. 7).

If two separate input channels become shorted together, then the phase and magnitudes of their measured test signals deviate from the stored reference values and this is reported as a channel independence fault. Since adjacent channels are more likely to short together than non adjacent channels, a mapping function block 34 shown in FIG. 3 is used to provide greatest phase separation for adjacent channels.

Figure 6:
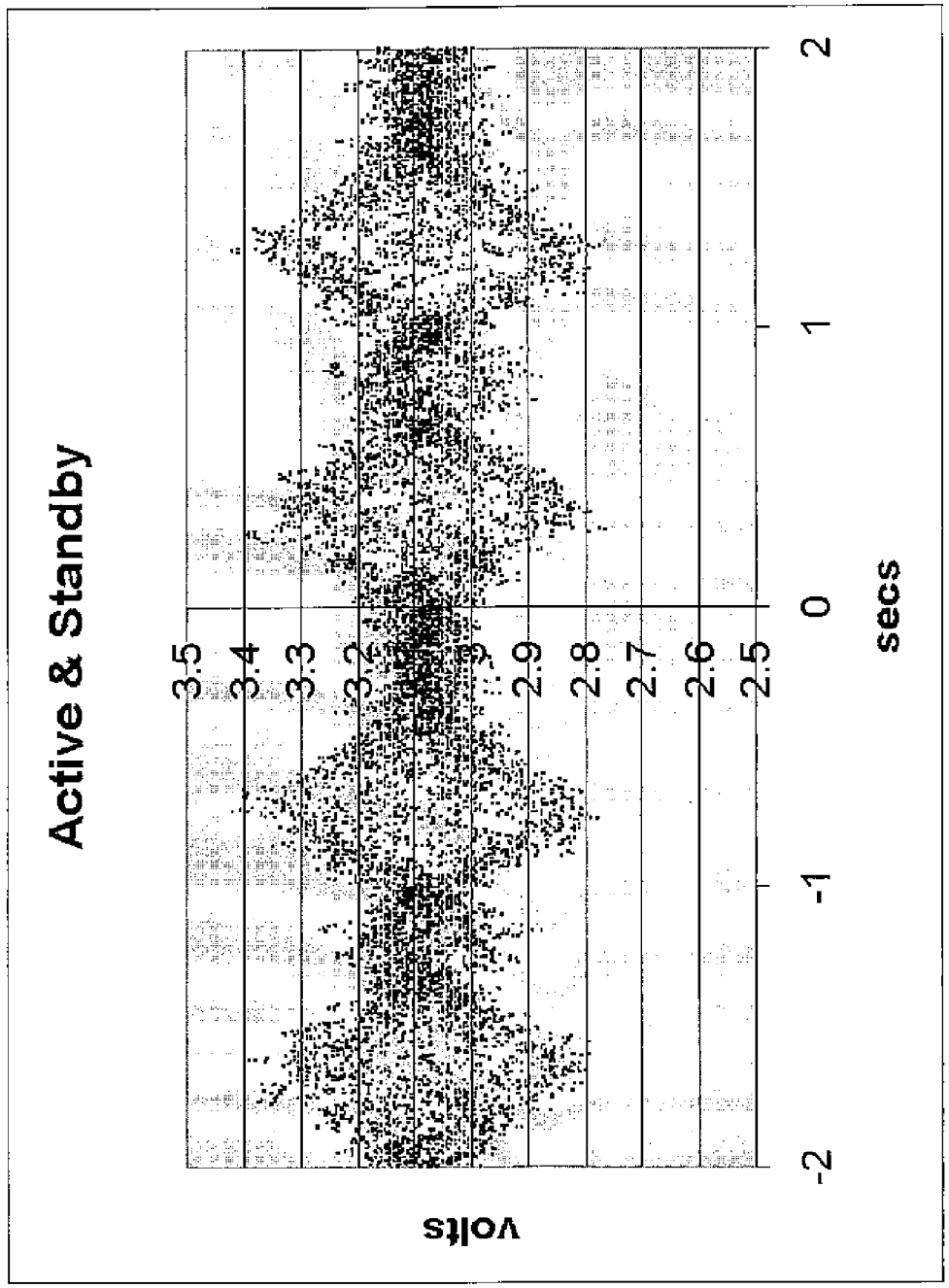
FIG. 6 illustrates a typical beat pattern when two signals of similar phase interfere with one another.

The three slices are connected together and to $V_{IN}$ at their input resistors. If the wire between the input module and the FTA is broken, then this junction is a high impedance, and the test signal from each slice is imposed upon it. The frequencies of operation of each slice are shifted by 0.2% from each other by virtue of a programmable frequency synthesizer in the FPGA. When an input is floating the test signals of all the slices that are connected to the input node (and are powered up) beat against each other, ie because of the similarity of the phase a distinctive variation in amplitude of the combined signal is observed, creating a pattern that is easily recognisable. This is shown in FIG. 6.

One feature of this approach is that when standby modules are inserted in parallel to the active module, and six slices are connected to each input, the beat frequency signal components become greater because each of the six slices is running at its own unique frequency.

The technique described here uses a continuous test signal with a unique phase and frequency for each input channel of each triplicated slice. The phase and amplitude of the test signals are extracted via quadrature signal processing and compared to stored reference values. By performing simple statistical analysis on the test signal phase and magnitude variation history it is possible to identify input channel slices that have open input faults, channel independence faults, as well as other component failures.

It is to be recognised that various alterations, modifications, and/or additions may be introduced into the constructions and arrangements of parts described above without departing from the scope of the present invention as defined in the following claims.

The invention claimed is:

1. A method of testing an input circuit comprising the steps of:
    generating a test signal which is periodic and has a predetermined phase and a predetermined amplitude;
    summing the test signal and an input signal to provide a summed signal;
    processing the summed signal with the input circuit to provide an output value;
    processing the output value to provide an output signal corresponding to the input signal;
    generating an extracted test signal from the output value corresponding to the test signal;
    comparing the extracted test signal with a reference signal representing said test signal;
    generating an error signal in dependence upon the result of said comparing step;
    whereby testing of the input circuit can be obtained during operation of the input circuit with the input signal.

2. The method according to claim 1, in which the test signal comprises a symmetrical signal having a test signal period and in which the output signal is produced by sampling the output value at intervals of a sample period and averaged over a moving average period equal to an integer multiple of the test signal period and in which the sample period is such that the average value of the contribution from the symmetrical test signal over said moving average period is equal to zero.

3. The method according to claim 2, in which the test signal is a sinusoidal signal.

4. The method according to claim 2, in which the moving average period is equal to the test signal period.

5. The method according to claim 4, in which the test signal period is 4 ms; the sample period is 1 ms, and an average of the previous four samples is generated every 1 ms.

6. The method in which a plurality of independent input circuits are tested according to the method of claim 1 and in which a plurality of test signals are generated by the steps of:
    generating a digital representation of a the test signal, the digital representation comprising a number of bits equal to the number of test signals to be generated;
    storing said digital representation in a shift register;
    generating a plurality of digital test signals from a plurality of taps from the shift register such that each digital test signal comprises a uniquely phased digital pattern;
low pass filtering each digital test signal to generate a plurality of unique analogue test signals.

7. The method according to claim 6, in which a first test signal used to test a first input circuit is arranged to have as great a phase separation as possible from a second test signal used to test a second adjacent input circuit.

8. An apparatus for testing an input circuit comprising:
    means for generating a test signal which is periodic and has a predetermined phase and a predetermined amplitude;
    an adder for summing the test signal and an input signal to provide a summed signal;
    means for processing the summed signal with the input circuit to provide an output value;
    means for processing the output value to provide an output signal corresponding to the input signal;
    means for generating an extracted test signal value corresponding to the test signal;
    a comparator for comparing the extracted test signal with a reference signal representing said test signal and for generating an error signal in dependence upon said comparison.

* * * * *